United States Patent
Clayton et al.

(10) Patent No.: US 6,665,190 B2
(45) Date of Patent: Dec. 16, 2003

(54) MODULAR PC CARD WHICH RECEIVES ADD-IN PC CARD MODULES

(76) Inventors: James E. Clayton, 6484 Olde Eight Rd., Peninsula, OH (US) 44264; Gary W. Hamilton, 3307 Park Hills Dr., Austin, TX (US) 78746

( * ) Notice: Subject to any disclaimer, the term of this patent is extended or adjusted under 35 U.S.C. 154(b) by 0 days.

(21) Appl. No.: 10/096,260

(22) Filed: Mar. 12, 2002

(65) Prior Publication Data

US 2002/0131245 A1 Sep. 19, 2002

Related U.S. Application Data

(63) Continuation of application No. 08/396,493, filed on Mar. 2, 1995, now abandoned, and a continuation-in-part of application No. 08/138,829, filed on Oct. 18, 1993, now Pat. No. 5,731,633, which is a continuation-in-part of application No. 07/947,293, filed on Sep. 16, 1992, now abandoned.

(51) Int. Cl.[7] .............................. H05K 1/14; H05K 7/18
(52) U.S. Cl. ................. 361/736; 361/684; 361/728; 361/737; 361/803; 439/260; 439/631
(58) Field of Search .................................. 361/683, 684, 361/685, 728, 729, 736, 737, 803; 439/260, 267, 631

(56) References Cited

U.S. PATENT DOCUMENTS 4,220,382 A * 9/1980 Ritchie et al. ............... 439/61
5,184,282 A * 2/1993 Kaneda et al. ............. 361/737
5,519,571 A * 5/1996 Shieh ......................... 361/685

* cited by examiner

Primary Examiner—Jayprakash N. Gandhi
(74) Attorney, Agent, or Firm—Hamilton & Terrile, LLP

(57) ABSTRACT

A modular and user configurable PC Card which removably receives one or more add-in modules that provide selected functionality. The user inserts and removes selected modules in the PC Card to configure the PC Card to the desired functionality. The PC Card includes one or more slots for receiving PC Card modules. PC Card slot openings are located on the narrow back end of the PC Card opposite the PCMCIA adapter, or alternatively are located on the wide end of the PC Card. In the preferred embodiment, the PC Card includes an internal module connector having connectors on either side. The PC Card modules are removably inserted into one of the one or more slots and connect to the module connector contacts on the module connector within the PC Card. In one embodiment, the PC Card includes a rotating cam which is turned to connect the module connector contacts on the module connector within the PC Card to the contacts on the removable PC Card module. Therefore, the modular PC Card of the present invention allows the user to removably insert one or more modules in the PC Card to select desired functionality. This provides increased options to the user over current prior art multifunction PC Cards.

22 Claims, 12 Drawing Sheets

MODULAR PC CARD WHICH RECEIVES ADD-IN PC CARD MODULES

CONTINUATION DATA

This is a continuation of Ser. No. 08/396,493, filed Mar. 2, 1995.

This is a continuation-in-part of U.S. patent application Ser. No. 08/138,829 filed Oct. 18, 1993 now U.S. Pat. No. 5,731,633 entitled "A Thin Multichip Module," whose inventor is James E. Clayton, which is a continuation-in-part of co-pending application Ser. No. 07/947,293 filed Sep. 16, 1992 now abandoned, entitled "A Thin Multichip Module," whose inventor is James E. Clayton.

FIELD OF THE INVENTION

The present invention relates to PC Cards, and more particularly to a modular PC Card which includes one or more slots for receiving add-in PC Card modules, thus enabling a single PC Card to provide modular and user selectable functionality.

DESCRIPTION OF THE RELATED ART

PC Cards were introduced in 1989 under the name "PCMCIA cards" according to a standard developed by the Personal Computer Memory Card International Association (PCMCIA). The original PCMCIA card specification was intended to define a standard for credit card sized memory cards. In 1995 the PCMCIA committee renamed the cards to "PC Cards."

The PCMCIA standard requires that all PC Cards have the same length and width, this being 85.6 mm by 54 mm, and that each card connect in a PC Card adapter slot using a standard 68 pin connector. The PCMCIA standard currently defines three types of PC Cards. Type I cards are limited to a thickness of 3.3 mm and are used principally as memory cards, including RAM cards, ROM cards and DRAM cards. Type II PC Cards can be up to 5.5 mm thick and are large enough to include I/O port connections, and thus most LAN (local area network) adapters and modems are type II PC Cards. Type III cards can be up to 10.5 mm thick and are typically used for products that require moving parts such as hard disks. PCMCIA PC Card slots are backwards compatible with regard to size, i.e., a type III slot also accepts type I and type II cards, but a type I slot will only receive type I cards.

The physical and electrical standards for PC Cards have evolved over time. The original PCMCIA 1.0 standard defined only type I Cards and did not define an I/O feature or software drivers. The PCMCIA 2.0 standard introduced I/O-specific cards, but did not define software driver specifications. Rather, software driver specifications were left to card manufacturers. The PCMCIA 2.1 standard introduced the use of software drivers called Card Services and Socket Services. These software driver standards helped solve many compatibility problems users experienced between different cards and slots. The PCMCIA 2.1 standard also introduced plug-and-play features such as the ability to hot swap cards without rebooting the PC.

The most recent PCMCIA PC Card standard is referred to by the PCMCIA Committee simply as the "PC Card standard" and does not include a version number. This standard includes new specifications for 32 bit bus mastering adapters, on board direct memory access (DMA), multi-function adapters, and reduced power requirements of 3.3 volts. Perhaps the most important new development in the PC Card standard is the support for multi-function adapters, wherein each PC Card can support two or more different functions. For example, Applicant is aware of currently available PC Cards which include, for example, Ethernet (LAN) and modem capabilities, embedded on a single PC Card.

The principal benefit of the PC Card standard has generally been portability. The PC Card standard was originally launched to specify credit card sized memory additions for notebook PCs. The PC Card standard has since become a delivery vehicle for many different types of PC peripherals, including modems, LAN adapters, sound cards, and hard disks. However, most current portable computers include one and at most two PC Card slots for receiving PC Cards. In addition, personal digital assistants (PDAs) generally only have sufficient size to support one PC Card slot. Therefore, it is highly desirable to provide multiple functionality in a single PC Card to allow greater functionality in portable systems and PDAs.

As noted above, the current PC Card standard supports multi-function PC Cards. Current PC Cards which include multiple functionality embed the multiple functionality in the card. However, it would be greatly desirable to provide a modular and user configurable PC Card wherein the user could insert one or more removable modules in the PC Card to select the desired functionality of the PC Card. Therefore, a new modular and user configurable PC Card is desired which allows the user to removably insert modules into the PC Card to select desired functionality of the PC Card.

SUMMARY OF THE INVENTION

The present invention comprises a modular and user configurable PC Card which removably receives one or more add-in modules that provide selected functionality. The user can thus insert and remove selected modules to/from the PC Card to configure the PC Card to the desired functionality. The PC Card preferably complies with JEDEC (Joint Electronic Device Engineering Council) standards and/or PCMCIA (Personal Computer Memory Card International Association) standards. Alternate embodiments comply with JEIDA (Japanese Electronics Development Association) standards, among others.

In the preferred embodiment, the PC Card comprises a frame including a cover plate. A connector, preferably a PCMCIA 68 pin connector, is comprised on a side or end of the frame and is adapted for mating to a corresponding socket. An internal module connector is comprised in the frame having connectors on either side. The PC Card frame preferably includes one or more slots or receptacles for receiving PC Card modules. PC Card slot openings are preferably on the narrow back end of the PC Card opposite the connector, or alternatively are located on the sides of the PC Card. In an alternate embodiment, the PC Card includes a hinged cover plate or lid, and the lid is opened to removably insert one or more modules in slots or receptacles within the PC Card. The PC Card modules are removably inserted into respective slots or receptacles and connect to the module connector contacts on the module connector within the PC Card. In one embodiment, the PC Card includes a rotating cam which is turned to help connect the module connector contacts on the module connector within the PC Card to the contacts on the removable PC Card module.

The PC Card modules are preferably multichip modules having an innovative design that supports a large number of semiconductor devices in a compact area. The PC Card modules may provide any of various types of functions including that of a modem, local area network (LAN) adapter, global positioning system (GPS) receiver, DRAM or SRAM memory module, flash memory module, MPEG decoders, etc.

Therefore, the modular PC Card of the present invention allows the user to removably insert one or more modules in a JEDEC or PCMCIA standard PC Card to select desired functionality. This provides increased options to the user over current prior art multi-function PC Cards.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Incorporation by Reference

The PC Card standard promulgated by the PCMCIA committee is hereby incorporated by reference in its entirety, including its specification for multi-function PC Card adapters. PC Card standards promulgated by JEDEC (Joint Electronic Device Engineering Council) and JEIDA (Japanese Electronics Development Association) are also hereby incorporated by reference in their entirety.

For information on PC Cards and the PCMCIA System Architecture, please see Anderson, Don *PCMCIA System Architecture*, available from Mindshare, Inc. 2202 Buttercup Dr., Richardson, Tex. 75082, which is hereby incorporated by reference in its entirety. For additional information on PC Cards and adding multiple functionality to a PC Card, please see Nass, Richard, "Multi-function Cards Pose Design Challenges", *Electronic Design*, Oct. 3, 1994, page 51; Nass, Richard, "PCMCIA Fax-Modem and LAN Run Simultaneously", *Electronic Design*, Oct. 3, 1994, page 131; and see Rigney, Steve "PCMCIA Connectivity: Socket To Us", *PC Magazine*, Volume 14, No. 2, page 207, Jan. 24, 1995, all of which are hereby incorporated by reference in their entirety.

Figure 1:
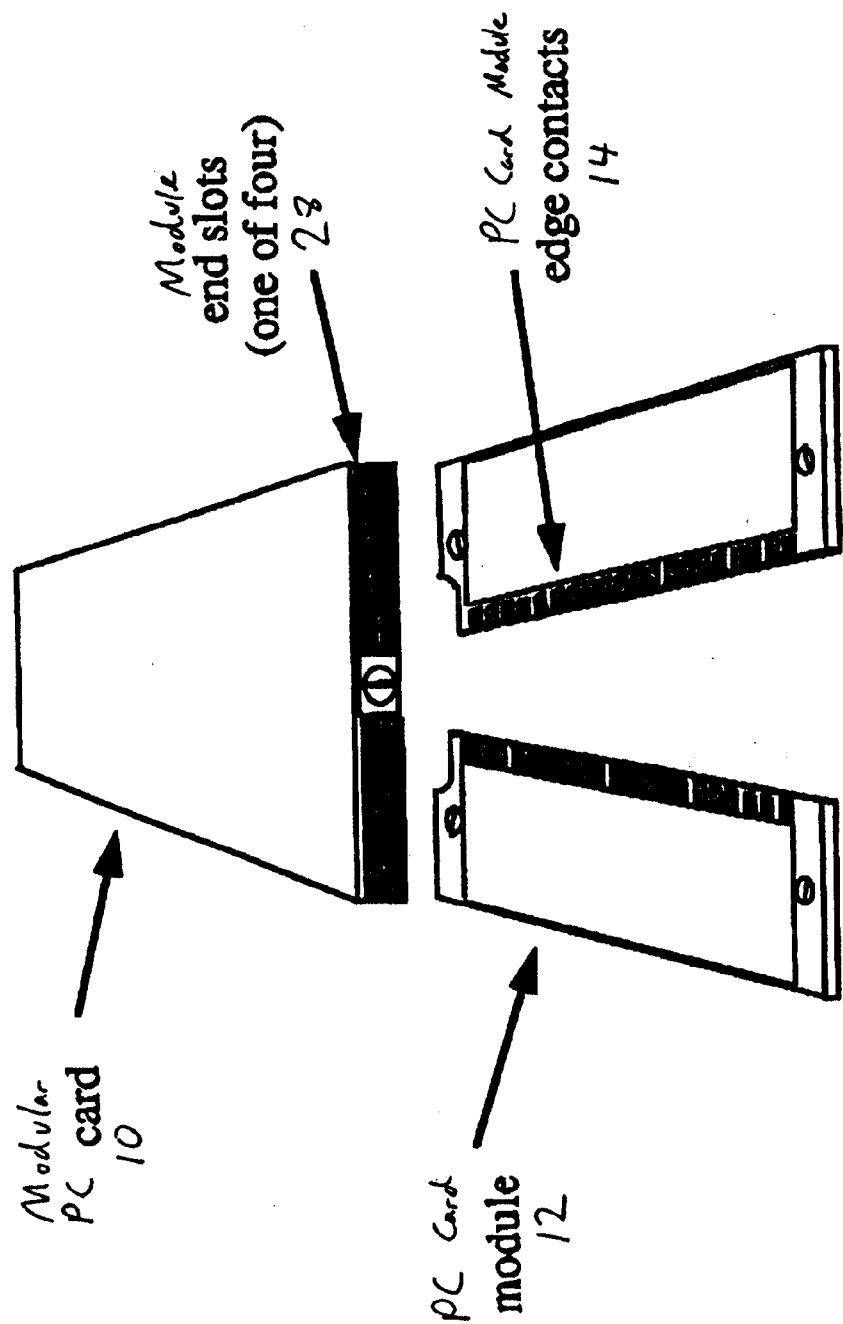
FIG. 1 illustrates a modular PC Card and two PC Card modules according to one embodiment of the present invention.

Referring now to FIG. 1, a modular PC Card 10 which receives one or more removable PC Card modules 12 according to the present invention is shown. The PC Card 10 preferably complies with JEDEC (Joint Electronic Device Engineering Council) standards and/or PCMCIA (Personal Computer Memory Card International Association) standards. Alternate embodiments of the invention comply with JEIDA (Japanese Electronics Development Association) standards, among others. It is noted that the PC Card 10 may comply with any of various mechanical and electrical standards.

The modular PC Card 10 preferably includes one or more module slots or receptacles 28, and FIG. 1 illustrates a modular PC Card 10 which includes four module end slots 28. The term "slot" is used herein to refer to the receptacle or void in which the module 12 is inserted. The PC Card modules 12 are removably inserted into the modular PC Card 10 to provide desired functionality to the PC Card 10. Each PC Card module 12 includes edge contacts 14 adapted for electrically connecting to a corresponding PC Card module connector (FIG. 3) comprised within the PC Card 10.

Each of the PC Card modules 12 is preferably a multi-chip module which provides a desired functionality. The PC Card modules 12 may provide any of various types of functions including that of a modem, local area network (LAN) adapter, global positioning system (GPS) receiver, DRAM or SRAM memory module, flash memory module, MPEG decoder, etc. Thus, each PC Card module 12 may provide any of various types of functionality. Each PC Card module 12 and/or PC Card 10 preferably includes the necessary logic for functioning according to a respective PC Card specification. In the preferred embodiment where the PC Card 10 conforms to the PCMCIA PC Card specification, the PC Card modules 12 preferably include logic which conforms to appropriate portions of the PCMCIA specification. In this embodiment, the PC Card modules 12 preferably include, for example, non-volatile memory for storing configuration data referred to as Card Information Structure (CIS). The structure of a PC Card module 12 according to the preferred embodiment is discussed below.

The modular PC Card 10 and removable PC Card modules 12 according to the present invention allow the user to select desired functionality of the PC Card 10 by removably inserting respective PC Card modules 12 in each of the module slots 28. If the user later desires a different functionality, the user can simply remove a PC Card module 12 from a slot in the modular PC Card 10 and insert a different PC Card module 12. The modular PC Card 10 of the present invention is especially advantageous in portable computer systems which typically include only one or two PC Card adapter sockets and also is especially advantageous in personal digital assistants (PDAs) which generally include only one PC Card adapter socket. Thus, the user can carry various PC Card modules 12 and removably insert selected PC Card modules 12 into the respective slots 28 of the modular PC Card 10, as desired, to achieve the desired functionality. It is noted that one or more PC Card modules 12 may be inserted into less than all of the available slots 28. In other words, the PC Card 10 can be used in a computer or PDA, wherein the PC Card 10 has one or more empty slots. In this instance, the connections of the unused slots 28 do not affect the functionality of the PC Card modules 12 plugged into the remaining slots 28.

Figure 2:
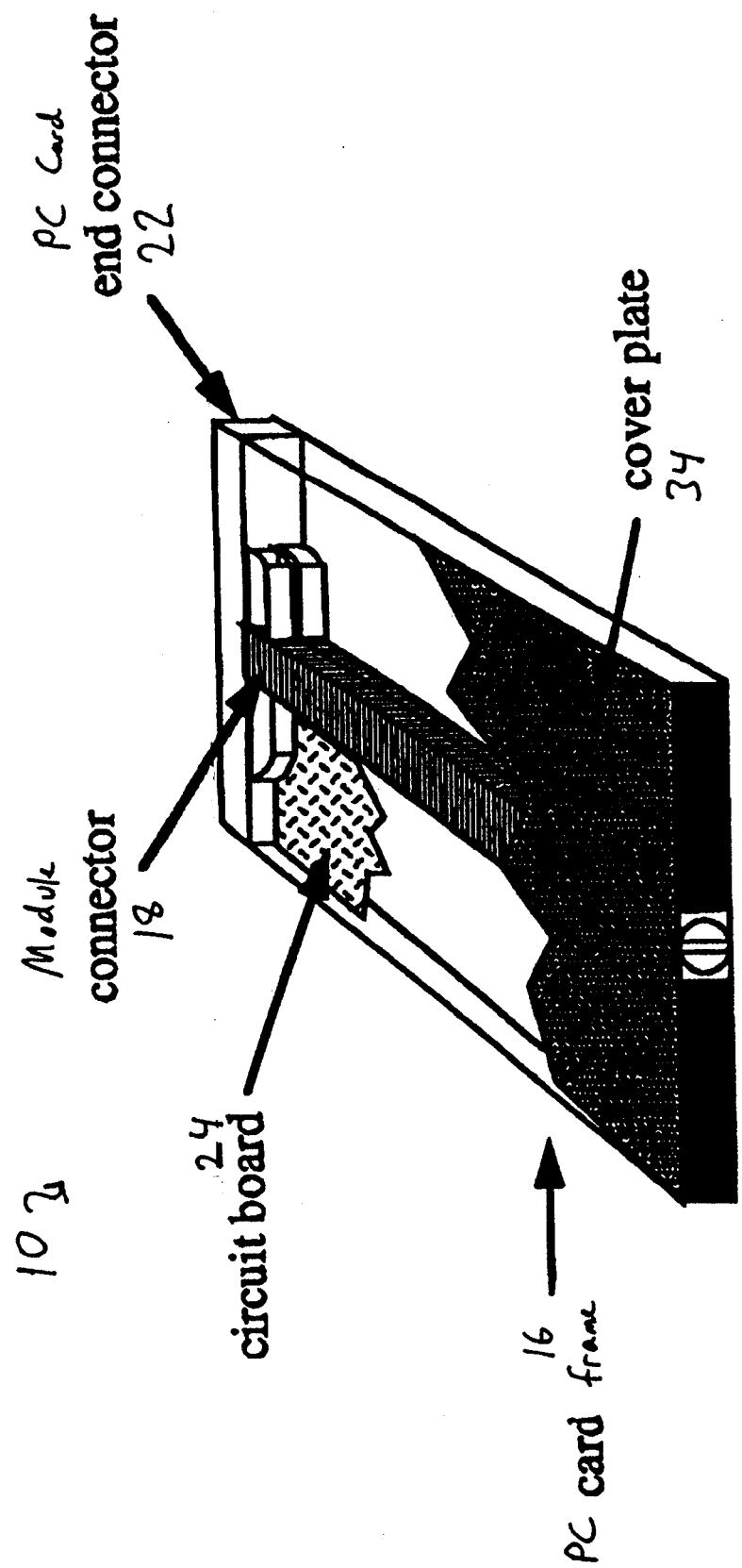
FIG. 2 is a cut-away perspective view of the PC Card of FIG. 1.

Referring now to FIG. 2, a cut-away view of the modular PC Card 10 is shown. As shown, the modular PC Card 10 includes a PC Card frame 16 and a cover plate 34. The frame 16 can comprise any of various types of structures. The PC Card frame 16 preferably includes first and second opposite sides and first and second opposite ends, as well as a bottom portion. The first and second opposite sides are longer than the first and second opposite ends according to the PC Card Standard. Cover plate 34 attaches to the top of the frame 16 as shown. Various other types of frame and cover plate configurations may be used, as is well known in the art.

Figure 13:
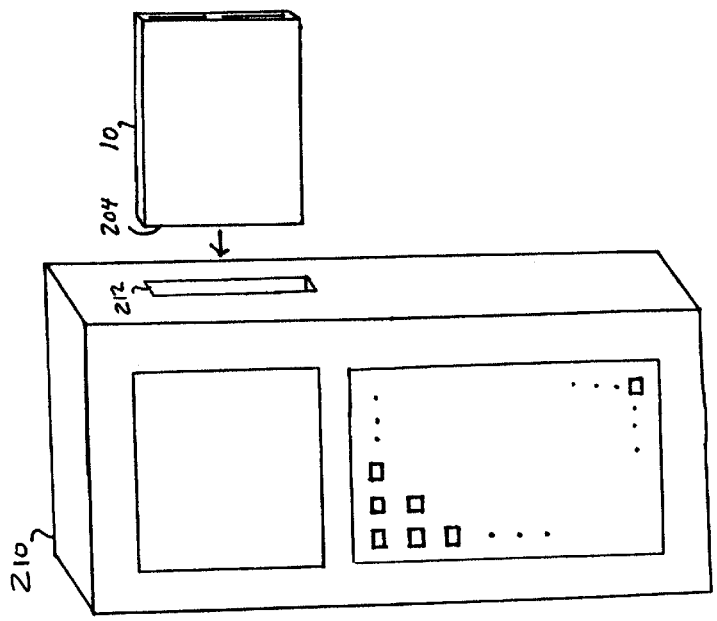
FIG. 13 is a perspective view of a personal digital assistant including a PC Card adapter slot for receiving a PC Card according to the present invention.
Figure 12:
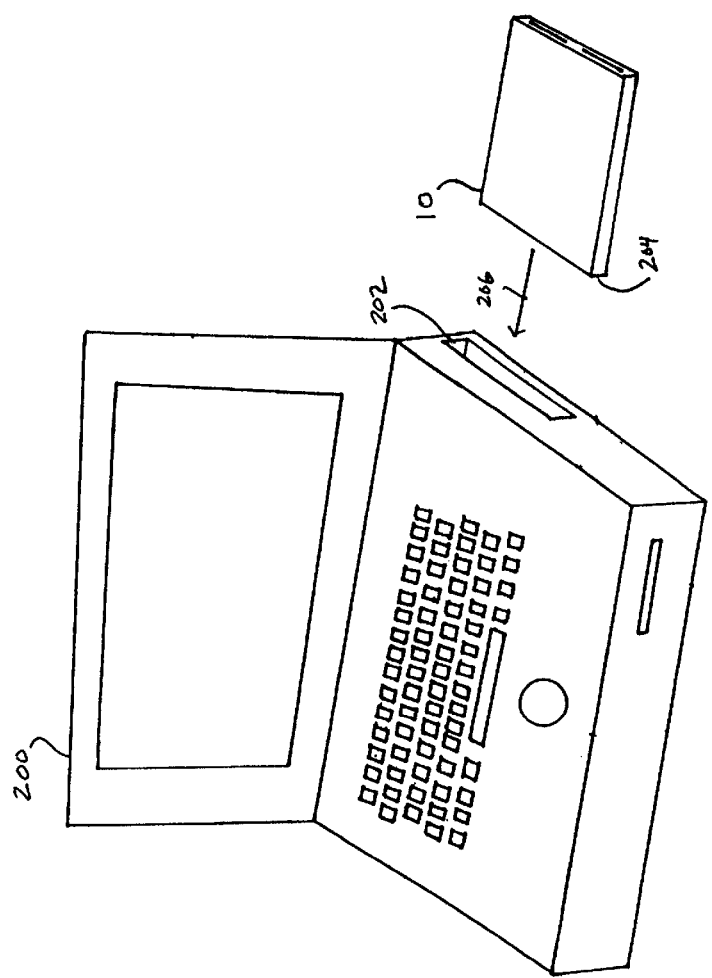
FIG. 12 is a perspective view of a portable computer system including a PCMCIA adapter slot for receiving a PC Card module according to the present invention.

The frame 16 of the modular PC Card 10 includes a PC Card end connector or socket connector 22 preferably at one end. In an alternate embodiment, the PC Card socket connector 22 is comprised on a side of the frame 16. The socket connector 22 is for mating to a PC Card socket. The socket connector 22 is preferably a standard PCMCIA 68 pin connector for attaching to a PCMCIA socket or PCMCIA adapter card slot (FIGS. 12 and 13). The modular PC Card 10 also includes a module connector 18 which includes contacts 20 (FIG. 3) on either side of the connector 18 for contacting with the edge contacts 14 on respective PC Card modules 12, as described further below.

The modular PC Card 10 also may include a circuit board 24 which provides additional functionality to that provided by the one or more PC Card modules 12. For example, the circuit board 24 may provide functionality for interfacing the one or more PC Card modules 12 to the PC Card socket connector 22 to allow each device or module 12 to operate properly within the system. For more information on interfacing multiple devices to PC Card socket connectors 22, please see the PC Card Standard referenced above. The circuit board 24 may also provide additional functionality, such as flash memory or DRAM, as desired.

Figure 3:
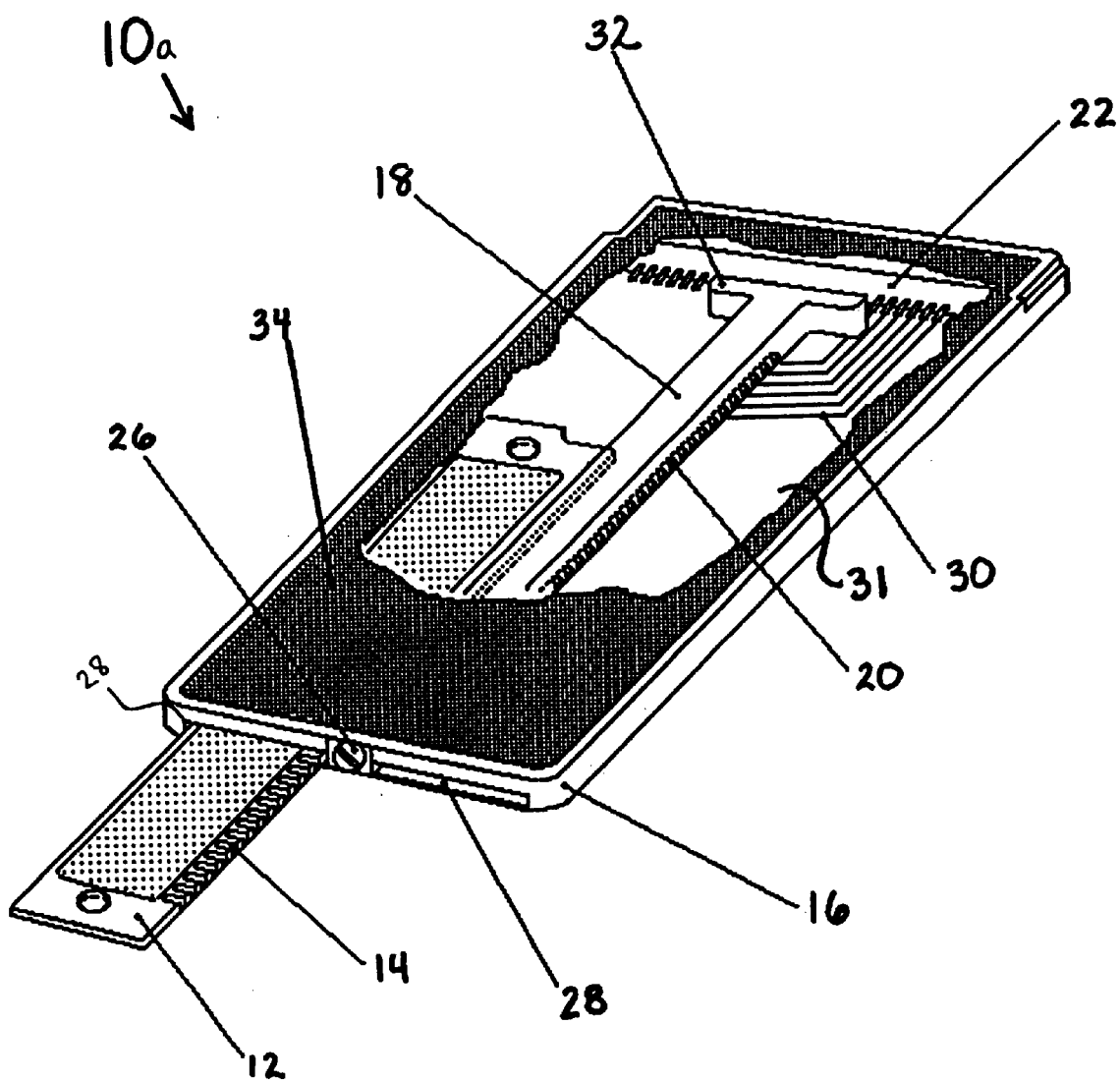
FIG. 3 is a more detailed perspective view of the modular PC Card having two module slots according to the preferred embodiment of the invention.

Referring now to FIG. 3, a more detailed cut-away view of modular PC Card 10a including two slots 28 according to the preferred embodiment of the invention is shown. As discussed above, the modular PC Card 10a includes frame 16 and cover plate 34 and also includes a PC Card end connector or socket connector 22 for connecting to a PC Card adapter socket. The modular PC Card 10a also includes module connector 18 which includes module connector contacts 20 on either side of the module connector 18. The module connector contacts 20 on either side of the module connector 18 are for electrically connecting to the contacts 14 on a respective PC Card module 12. The module connector contacts 20 may be any of various types of contacts, including stamped metal contacts, elastomeric connectors or bi-metal spring connections. Other types of electrical contacts 20 may be used, as is well known in the art. Any of various electrical contact methods or structures may be used to electrically connect the contacts 20 in the PC Card 10a to the contacts 14 on the PC Card module 12.

Signal traces 30 on inner surface 31 of the floor of frame 16 connect the module connector contacts 20 on either side of the module connector 18 to the electrical connectors on the PC Card socket connector 22. Similar traces may be routed on the inner surface of the cover plate 34 or circuit board 24, shown in FIG. 2, if necessary or desired. In the diagram of FIG. 3, module connector contacts 20 and signal traces 30 are shown on only one side of the module connector 18 for simplicity, it being understood that similar contacts and traces are provided on the other side of the module connector 18.

The modular PC Card 10a shown in FIG. 3 includes two module slots 28, each adapted for receiving a PC Card module 12. Various embodiments of the PC Card 10a include one or more slots for receiving one or more modules 12, as desired. As noted above, the term "slot" is used herein to refer to the receptacle or void in which the module 12 is inserted. In this embodiment, slot openings for the slots 28 are comprised at one end of the frame 16 opposite the socket connector 22. As shown, the PC Card module 12 is inserted into PC Card slot 28 so that the connectors 14 on the PC Card module 12 contact the module connector contacts 20 on the module connector 18. The module connector 18 preferably includes a polarization key 32 which prevents the PC Card module 12 from being wrongly inserted into the modular PC Card 10a.

The modular PC Card 10a preferably includes a rotating cam 26 which is positioned at the center of the modular PC Card 10a. Rotation of the rotating cam 26 causes the module connector contacts 20 to move outward to the respective inserted PC Card modules 12 and apply pressure against the contacts 14 on each of the respective PC Card modules 12. Therefore, after one or more PC Card modules 12 have been inserted in the respective slots 28, the user preferably rotates the rotating cam 26 which in turn forces the PC Card module connector contacts 20 outward to electrically contact the contacts 14 on the PC Card module 12. It is noted that other methods may be used to more securely electrically connect the contacts 14 on the PC Card module 12 to the module connector contacts 20 on the module connector 18. For example, in an alternate embodiment, mere insertion of the PC Card modules 12 in the respective slots 28 causes the contacts 14 on the PC Card module 12 to electrically connect to the contacts 20 on the module connector 18. In this embodiment, the rotating cam 26 could be included to add reliability to the electrical contact or to securely lock the module 12 in place.

Although not shown in FIG. 3, the modular PC Card 10a may include circuit board 24 (shown in FIG. 2) for additional functionality, if desired. In addition, various electronic devices can be mounted to inner surface 31, as desired.

In an alternate embodiment of the invention (not shown), the module connector contacts 20 within the modular PC Card 10 are comprised on the outer edges of the PC Card 10, and the PC Card module 12 is inserted such that the contacts 14 face toward the outer edge of the PC Card 10 to electrically contact the contacts 20 at the outer edge of the PC Card 10. In other words, in this embodiment the PC Card module 12 is rotated 180° from that shown in FIG. 3 and then inserted such that the PC Card module contacts 14 are positioned from the center spine of the PC Card 10 and electrically contact the connector contacts 20 located on the outer edge of the PC Card 10. Alternatively, the module 12 is inserted with the same orientation but into the slot on the opposite side so that contacts 14 are positioned along the outer edge. In this embodiment, respective polarization keys are positioned at the outer edges of the PC Card 10 to prevent wrongful insertion of the PC Card module 12.

Figure 4:
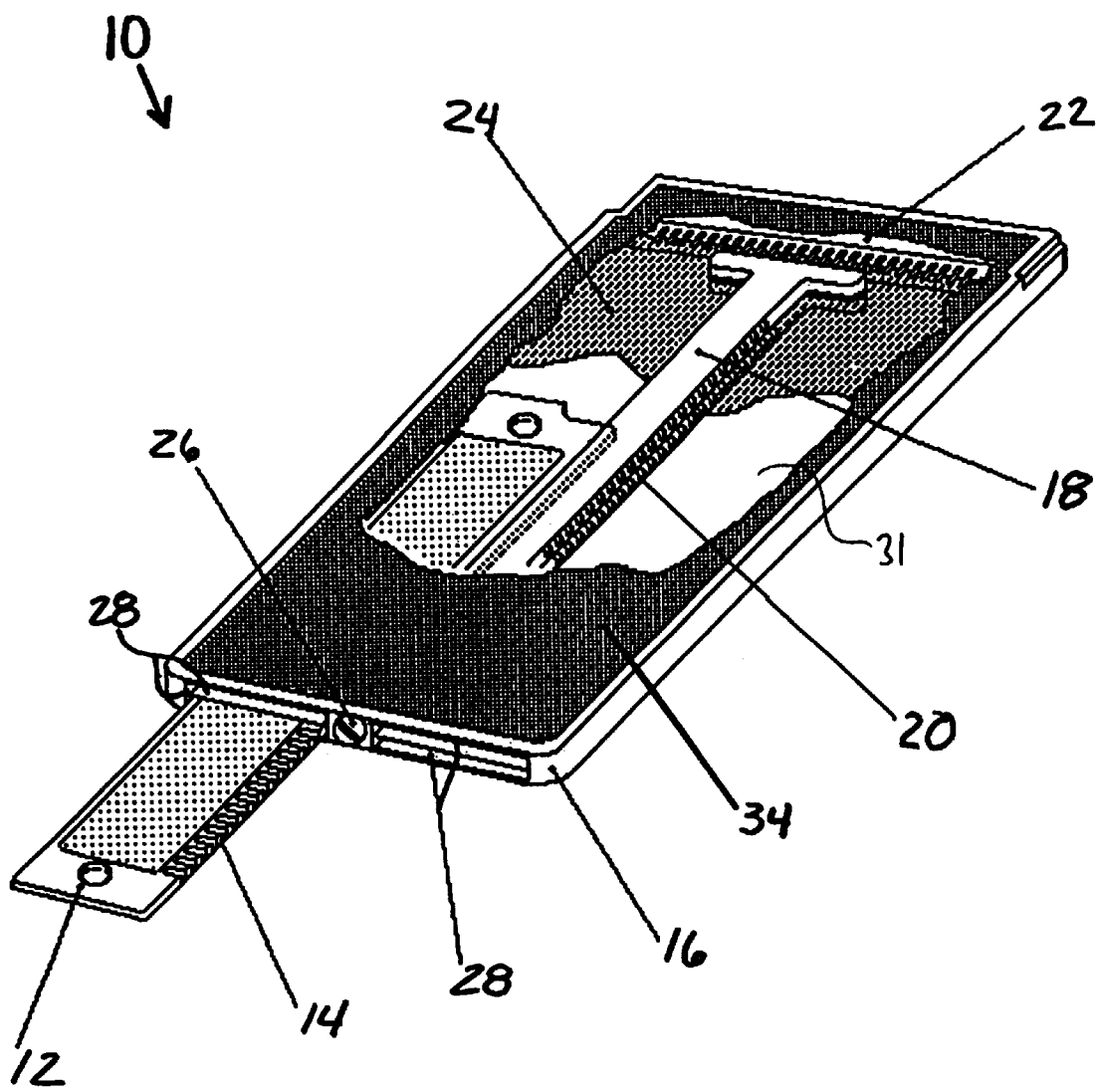
FIG. 4 is a detailed perspective view of an embodiment of the modular PC Card including four slots for receiving four PC Card modules.

FIG. 4 is a cut-away illustration of the modular PC Card 10 of FIG. 1 according to the present invention wherein the modular PC Card 10 includes four PC Card module slots 28. The embodiment of FIG. 4 is currently equally preferred to that of FIG. 3. The four module slots 28 comprise top and bottom slots with respective openings at one end of the frame 16 located on either side of the cam 26. The modular PC Card 10 illustrated in FIG. 4 also preferably includes a circuit board 24 which further serves to separate the top and bottom PC Card modules 12. Thus, when four PC Card modules 12 are inserted into the modular PC Card 10, the circuit board 24 separates the two top PC Card modules 12 from the two bottom PC Card modules 12. The circuit board 24 may also include any of various types of functionality, including logic to allow each of the four PC Card modules 12 to electrically interface to the single PC Card socket connector 22, including logic for sharing interrupts, addressing, etc. Element 24 may also simply comprise a thin electrically insulative plate to provide physical and/or electrical separation between the two top and two bottom PC Card modules 12.

Figure 5:
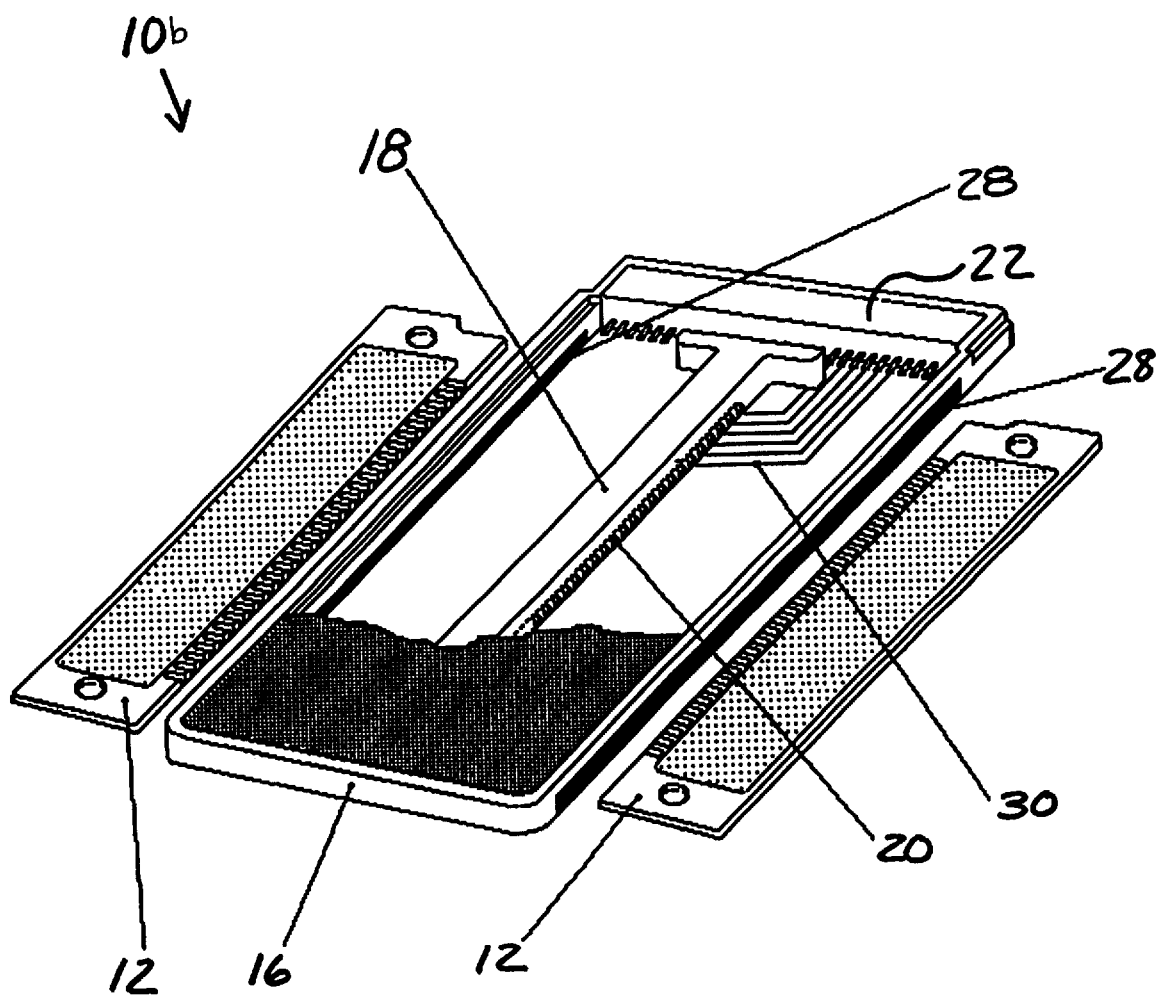
FIG. 5 is a perspective view of the PC Card which receives PC Card modules from side slots according to an alternate embodiment of the invention.

FIG. 5 illustrates an alternate embodiment of the modular PC Card 10b according to the present invention, wherein the slot openings are located on the sides of the frame 16 and the PC Card modules 12 are inserted from the sides of the modular PC Card 10b. The modular PC Card 10b according to this embodiment may include one or more slots to receive either one or more PC Card modules 12, respectively, as desired. This embodiment preferably includes either two or four slots. This embodiment may provide easier insertion of the PC Card modules 12 into the modular PC Card 10b. As shown, rotating cam 26 is not necessary in this embodiment. Also, this embodiment provides the advantage that the modules 12 are not inserted from the end of the PC Card 10b but rather are inserted from the sides, and thus the end of the PC Card 10b opposite the end connector 22 can be used for other connectors, as described below.

Figure 6:
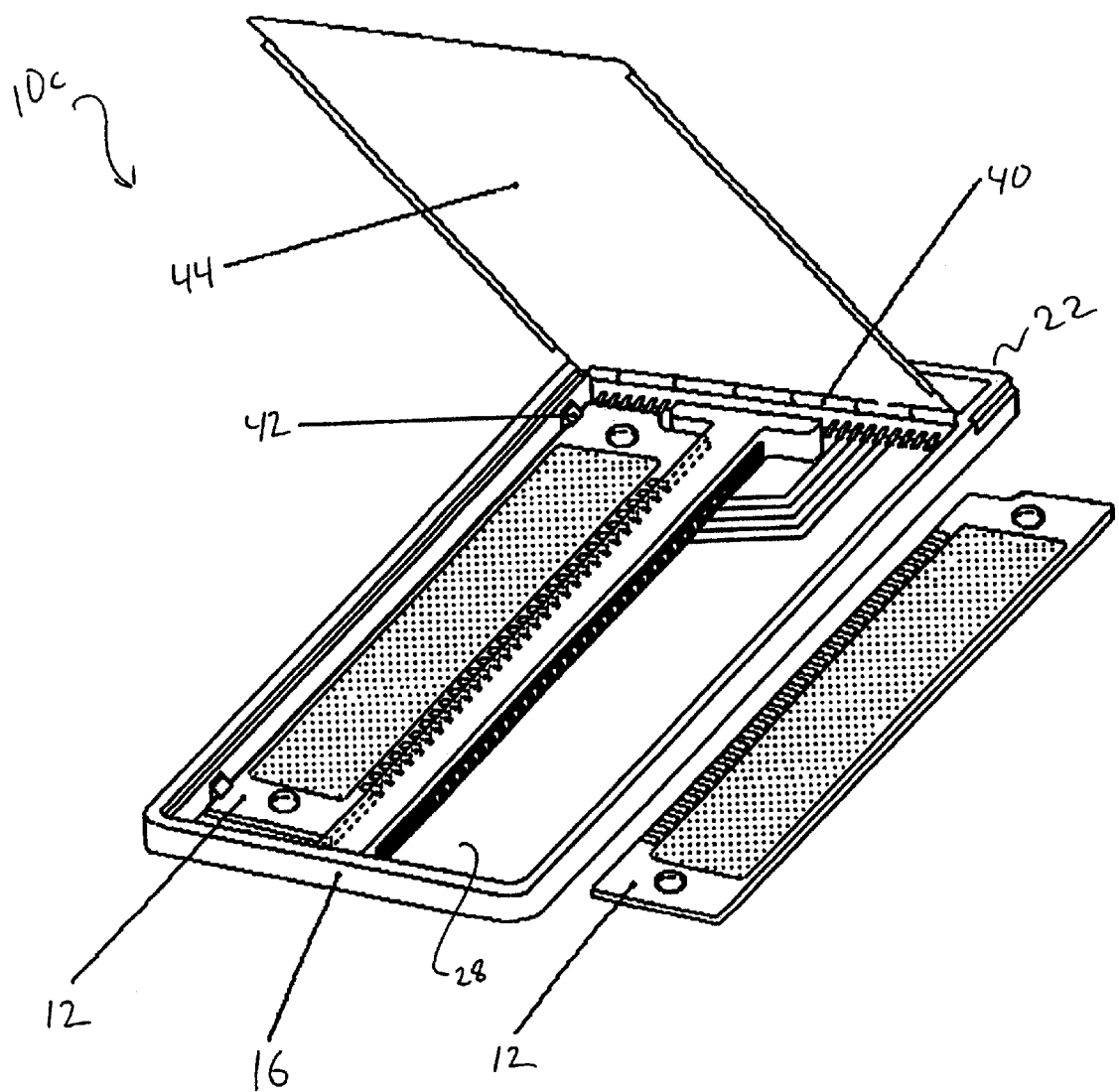
FIG. 6 illustrates a PC Card including a hinged cover plate according to an alternate embodiment of the invention.

FIG. 6 illustrates an alternate embodiment of the modular PC Card 10c according to the present invention, wherein the PC Card includes a hinged cover plate or lid 44. The lid 44 is attached to frame 16 by hinge 40. As shown, add-in modules 12 are inserted by opening the hinged cover plate or lid 44 and placing one or more modules 12 into slots or receptacles 28 in the PC Card 10c. In the present disclosure, the term "slot" is used to refer to the slots 28 in the embodiments of FIGS. 1–9, as well as other voids or mechanisms for containing or receiving the modules 12. Spring loaded clips 42 act to lock the module 12 in place. Like the embodiment of FIG. 5, this embodiment provides the advantage that the modules 12 are not inserted from the end of the PC Card 10c, and thus the end of the PC Card 10c opposite the end connector 22 can be used for other connectors, as described below. The modular PC Card 10c according to this embodiment may receive either two or four PC Card modules 12 as desired. This embodiment may also provide easier insertion of the PC Card modules 12 into the modular PC Card 10c.

Figure 7:
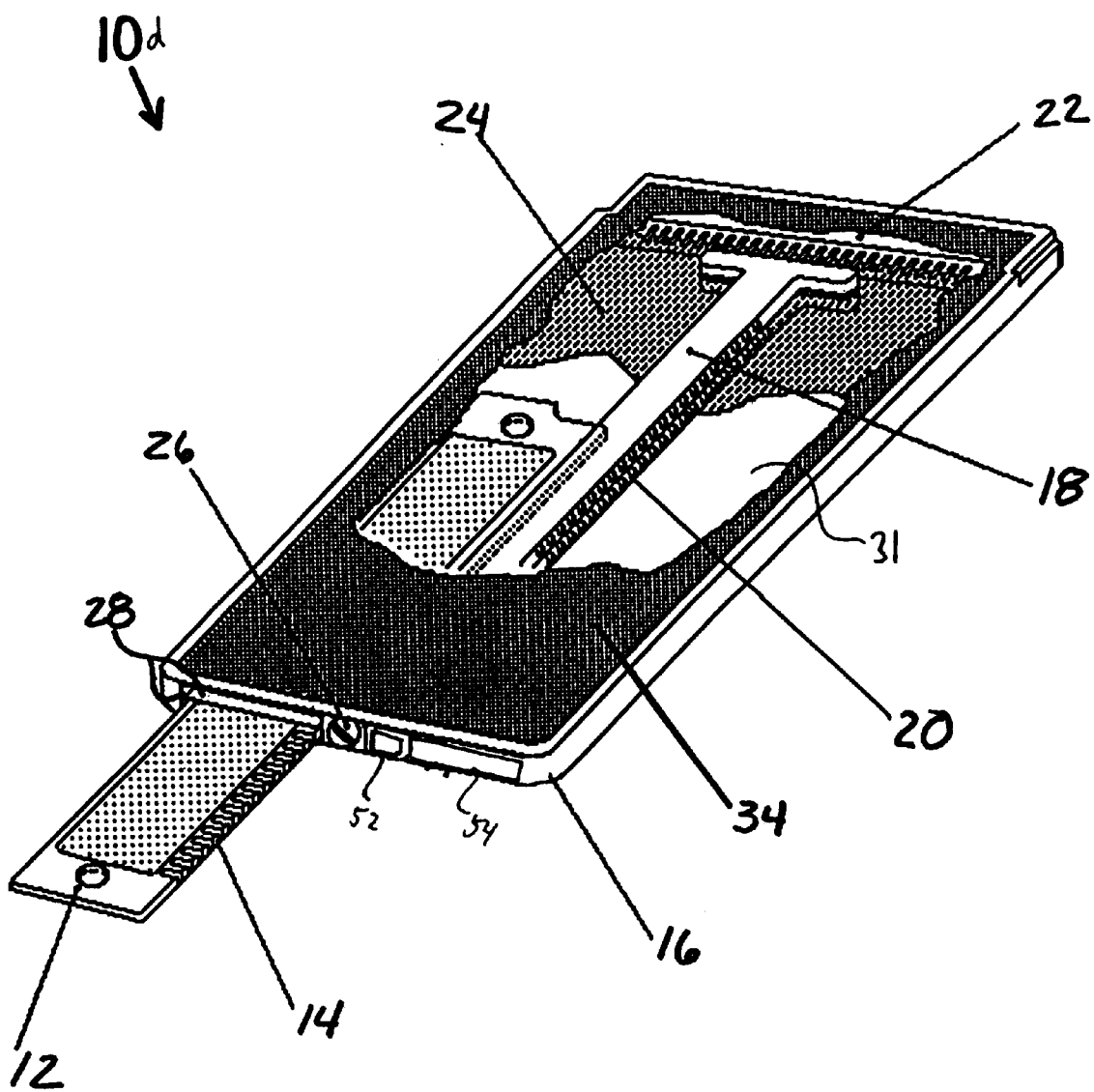
FIG. 7 illustrates an embodiment of the PC Card including one or more end slots for receiving add-in modules and also including phone and network connectors.

As noted above, the PC Card modules 12 may provide various types of functionality. In the embodiment of FIG. 7, the modular PC Card 10d is configured similarly to that shown in FIG. 4 except that one side of the modular PC Card 10d is not adapted for receiving PC Card modules 12, but rather includes either a phone connector 52 or a LAN or network connector 54, or both, either of which are activated when PC Card modules 12 are inserted into the modular PC Card 10d including modem and/or LAN capabilities. In other words, this embodiment is similar to that shown in FIG. 4 except that one side, for example the left side as shown in FIG. 7, is reserved for PC Card modules 12, and the other side, in this example the right side, is adapted to include the phone connector 52 and/or the LAN connector 54 which provide this connectivity when modules 12 having modem or LAN functionality are inserted.

Figure 8:
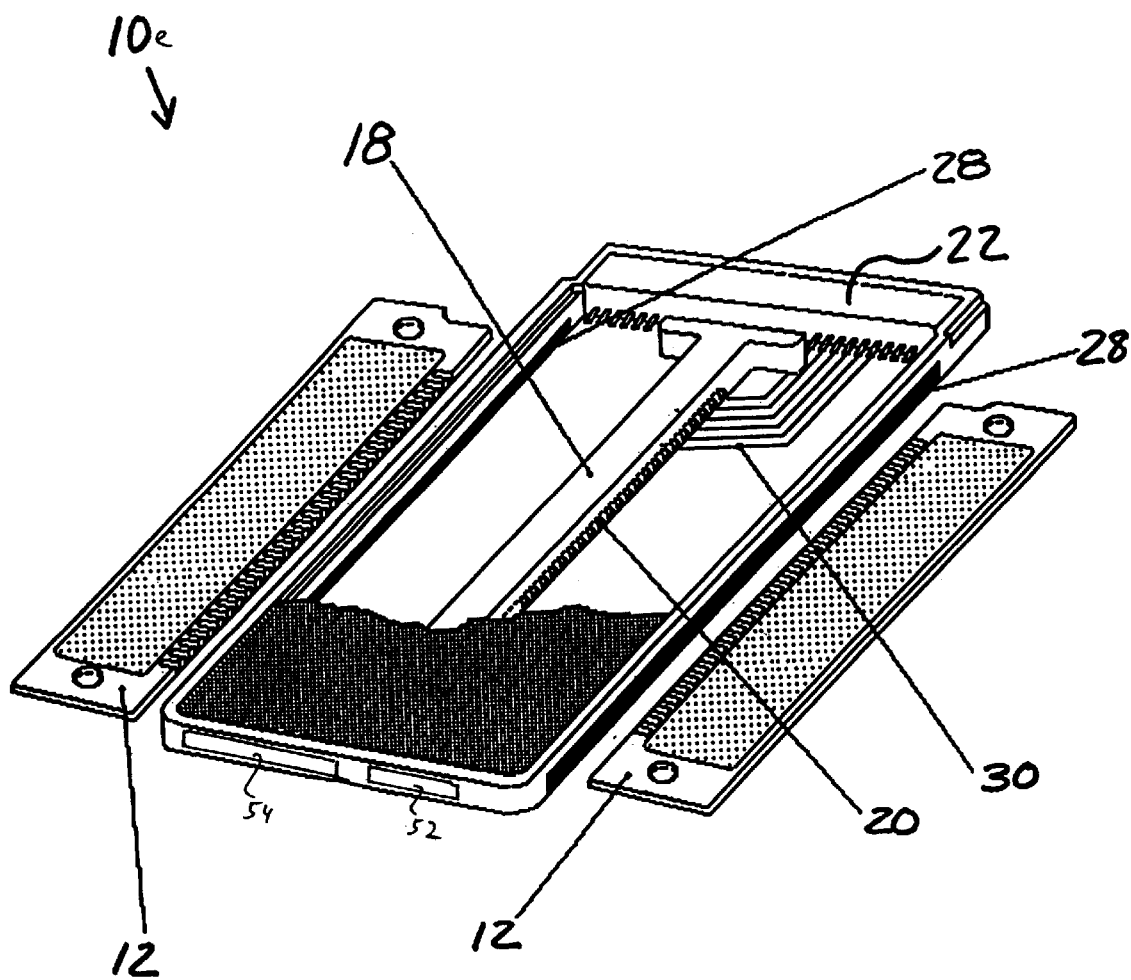
FIG. 8 illustrates an embodiment of the PC Card including one or more side slots for receiving add-in modules and including phone and network connectors comprised on an end of the card.

FIG. 8 illustrates an embodiment similar to FIG. 5 where the PC Card modules 12 are inserted from the sides of the PC Card 10e, wherein the edge of the modular PC Card 10 opposite the PC Card connector 22 includes one or more of either a phone connector 52 or LAN connector 54 or other connectors, as desired. In this embodiment, the respective connectors 52 and 54 are enabled when modules 12 having this respective functionality are inserted.

Figure 9:
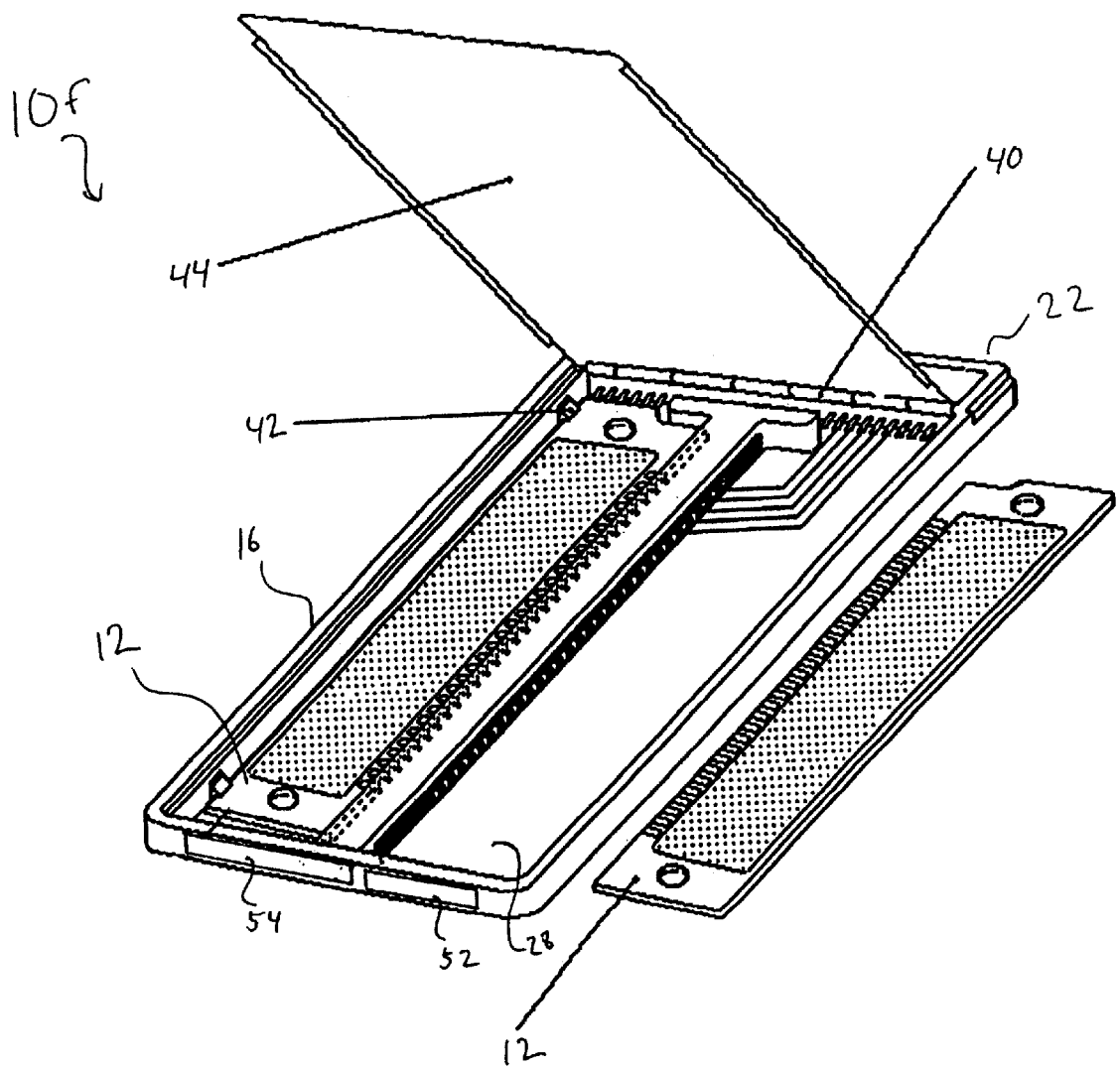
FIG. 9 illustrates an embodiment of the PC Card including a hinged cover plate and including phone and network connectors comprised on an end of the card.

FIG. 9 illustrates an embodiment similar to FIG. 6 including a hinged cover plate 44 where the PC Card modules 12 are inserted from the top of the PC Card 10f, wherein the edge of the modular PC Card 10f opposite the PC Card connector 22 includes one or more of either a phone connector 52 or LAN connector 54 or other connectors, as desired. In this embodiment, the respective connectors 52 and 54 are enabled when modules 12 having this respective functionality are inserted.

Alternatively, in the embodiments of FIGS. 3 and 4, if the PC Card module 12 is configured as a modem, the PC Card module 12 can include one or more phone connectors for connecting to a standard phone line. Alternatively, if the PC Card module 12 is configured as a LAN adapter module, then the module 12 can include a LAN connection. Phone and LAN connections are preferably configured at the end of the PC Card module 12 that is external to the modular PC Card 10 when the module 12 is fully inserted in the PC Card 10. It is noted that this embodiment is less desirable because the connectors will generally be considerably wider than the modules 12.

The embodiments of either FIG. 3 or 4 may also be modified wherein one side is reserved for one or more PC Card modules 12 while the other side is permanently configured as a hard disk, modem, flash memory or other type of memory.

Figure 10:
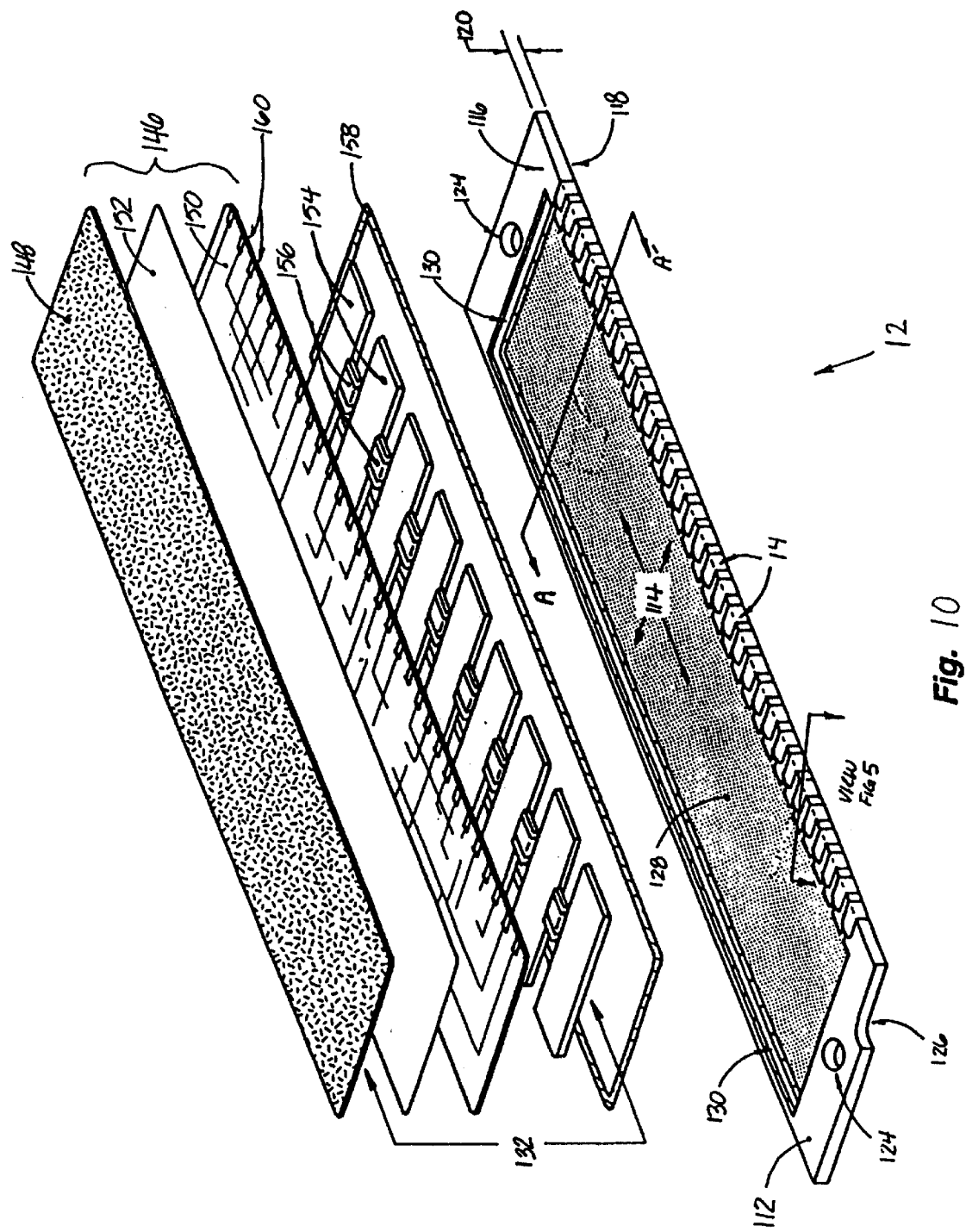
FIG. 10 is an exploded view illustrating the PC Card module according to the preferred embodiment of the invention.

Referring now to FIG. 10, a diagram illustrating the configuration of a PC Card module 12 according to the preferred embodiment of the invention is shown. FIG. 10 is an exploded view of the major components of the preferred embodiment of the module 12 employing a molded module frame 112 and subassembly 132. As shown in FIG. 10, the module 12 is preferably a multichip module which enables a substantial reduction in the volumetric capacity and areal spacing between multiple adjacent vertical rows or horizontal layers of modules. Thus, the module 12 allows a large volume of semiconductor devices to be included in a given space. It is noted that other module embodiments, including overmolded embodiments, may be used as desired.

The module 12 shown in FIG. 10 comprises a molded module frame 112 (hereinafter referred to as either "molded frame" or "module frame" or "frame") having electrical contacts 14, composite substrate 146 including cover plate 148, laminate circuit 150 and film adhesive 152, and a plurality of semiconductor devices 154 mounted to the composite substrate 146. An anisotropic ring 158 is optionally used to connect the composite substrate 146 to the molded frame 112. The module 12 is adapted for insertion into slot 28 of PC Card 10, and contacts 14 are adapted for mating to contacts 20 on the module connector 18 of PC Card 10.

In the embodiment of FIG. 10, the molded module frame 112 comprises an internal cavity 114 which extends over a substantial portion of the length and width of the module to provide a nesting area for electronic components in the finished module assembly. The molded module frame 112 can be manufactured using various materials.

The molded module frame 112 comprises first and second major parallel planes, illustrated by reference numerals 116 and 118, respectively, that are separated by a specified edge thickness, illustrated by reference numeral 120. An array of contact pads 14 along one edge of frame 112 provides electrical connection between the semiconductor devices contained within the interior of the module 12 and contacts 20 on the module connector 18. In the embodiment illustrated in FIG. 10, frame 112 is provided with two optional end holes 124 and a corner notch 126.

The internal cavity 114 can extend either partially or completely through the stepped ledge 130 and/or edge thickness 120, depending upon the spacing requirements of the components contained in the module frame 112. Although it is possible to construct a frame to have a single internal cavity, it is also possible to create first and second internal cavities by forming a thin, integrally molded floor 128 positioned along the centerline of the module thickness. For example, the molded floor 128 may be configured along the centerline of the module thickness to form first and second internal cavities, respectively. In this embodiments, the first and second internal cavities are on opposite sides of the module 12, and a plurality of semiconductor devices 154 and accompanying composite substrate 146 are included in each cavity.

A stepped ledge 130 is formed along the circumference of the cavity(s) 114 to provide a receiving area for mating subassembly(s) 132 described below. In the preferred embodiment, the ledge 130 is recessed below the first major plane 116 such that after subassembly(s) 132 is positioned and sealed or fixed in place, the outer surface of subassembly 132 and major plane 116 of molded frame 112 are substantially flush to one another. In an embodiment having two internal cavities, the ledges 130 in each cavity are recessed below the first major plane 116 in the first cavity and the second major plane 118 in the second cavity.

The composite semiconductor substrate assembly 132 ("subassembly") includes a composite substrate 146 which comprises a thin metal cover plate 148 and thin laminate circuit 150 which is bonded to the metal cover plate 148 by a film adhesive 152. The laminate circuit 150 provides electrical connection between the electronic devices 154 and discrete components 156. The composite substrate 146 provides a rigid mounting surface for the placement of semiconductor devices 154 and their associated passive components 156. The subassembly 132 is preferably attached to the molded frame by a rectangular ring 158 formed from an anisotropic, electrically conductive adhesive material.

Figure 11:
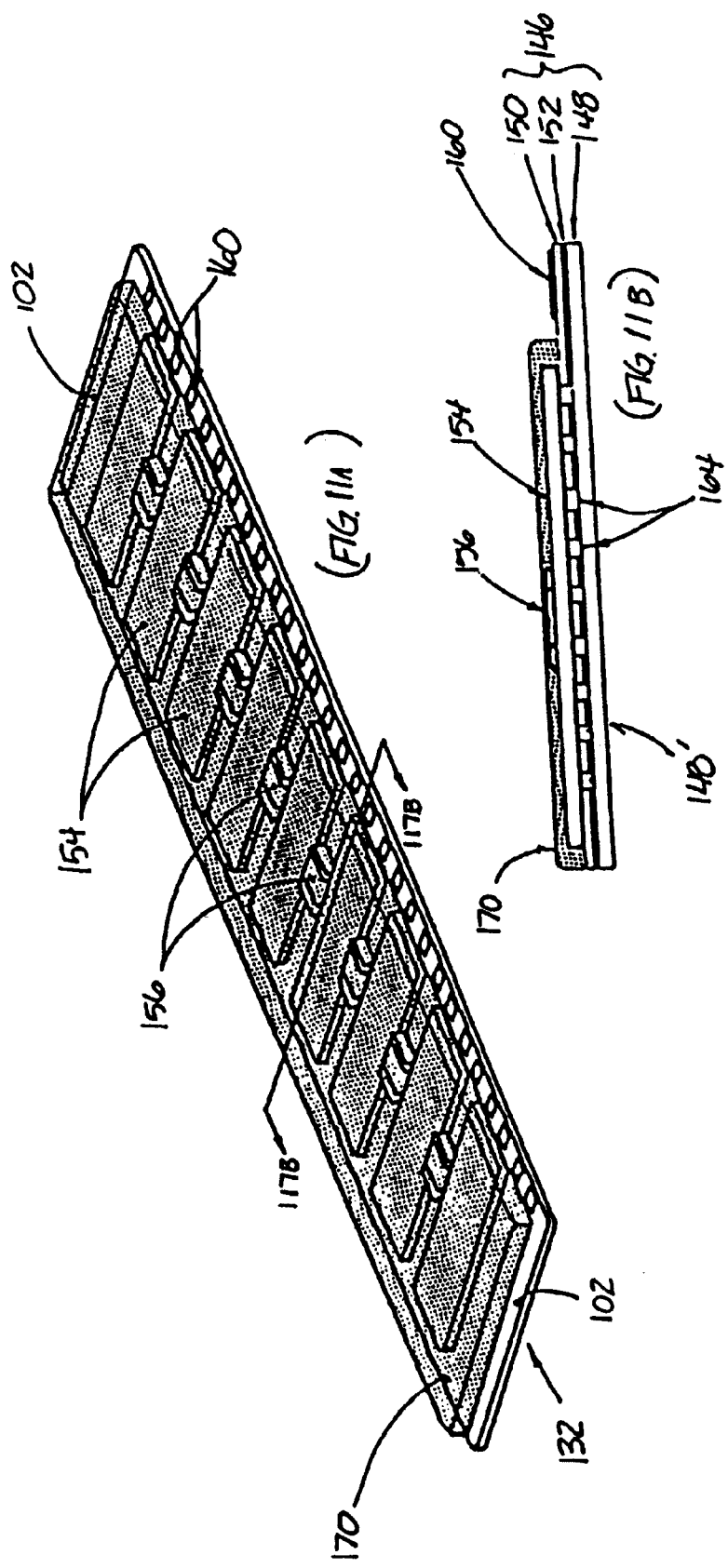
FIG. 11 illustrates a PC Card module according to an alternate embodiment of the invention.

Referring now to FIG. 11, an alternate embodiment of the add-in module 12 having an overmolded structure is shown. In this embodiment of the add-in module 12, subassembly 132 is assembled independently of the molded frame 112 by applying or molding a protective overcoat 170, as shown in FIG. 11. As shown in FIGS. 11A–B, the subassembly 132 comprises a composite substrate 146 preferably including cover plate 148 and thin laminate circuit 150 that is bonded to the cover plate 148 by film adhesive 152. A plurality of semiconductor devices 154 and passive components 156 are mounted on the laminate circuit 150. The protective overcoat 170 comprises an epoxy resin, thermal plastic encapsulant or similar mold compound or plastic laminate film and covers the semiconductor devices 154, passive components 156 and substantial surface of the thin laminate circuit 150, while leaving substrate pads 160, end surfaces 102 (optional) and external surface 148' of the cover plate 48 exposed. Alternatively, subassembly 132 could be completely encapsulated by the protective overcoat 170 leaving leads 140 or 140' protruding from the edge. Other overcoated embodiments may be used as desired.

For more information on the PC Card module 12 of the preferred embodiment, as well as other embodiments, please see U.S. patent application Ser. No. 08/138,829 filed Oct. 18, 1993 titled "A Thin Multichip Module," whose inventor is James E. Clayton, and U.S. patent application Ser. No. 07/947,293 filed Sep. 16, 1992 titled "A Thin Multichip Module," whose inventor is James E. Clayton, which are both hereby incorporated by reference in their entirety. Any of the various multi-chip module embodiments disclosed in the above patent applications may be used for the PC Card module 12, as desired.

Referring now to FIG. 12, a perspective view is shown of a computer system 200 including a PC Card socket or adapter slot 202 for receiving the modular PC Card 10 according to the present invention. Although not explicitly shown, the PC Card 10 preferably includes a PCMCIA 68 pin connector 204 which electrically interfaces with a PCMCIA 68 pin connector (not shown) within the computer system 200. Thus, the PC Card 10 is inserted with the connector 204 first into the slot 202 until the PCMCIA connectors are electrically and mechanically mated together. The computer system 200 is preferably a portable computer system, although any computer system including a PC Card adapter socket and corresponding PCMCIA circuitry is sufficient for purposes of the present invention.

FIG. 13 is a perspective view of a PDA 210 including a PC Card adapter socket 212 for receiving a PC Card 10 according to the present invention. The PC Card 10 is inserted into the adapter socket 212 in a similar manner as described above for the computer 200.

Therefore, a modular PC Card 10 is shown and described. The modular PC Card 10 according to the present invention receives one or more PC Card modules 12. PC Card modules 12 are removably inserted into the PC Card and the user inserts and removes PC Card modules 12 into the modular PC Card 10 to achieve desired functionality. The present invention is particularly advantageous in portable computer systems and PDAs which have a limited number of PC Card adapter slots.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

What is claimed is:

1. A modular PC Card adapted for insertion into a socket, wherein said modular PC Card receives one or more removable PC Card modules, comprising:

a frame including one or more slots for receiving PC Card modules;

a module connector comprised in said frame including a plurality of contacts;

a socket connector attached to said frame adapted for connection to a mating socket, wherein said socket connector is electrically connected to said plurality of contacts on said module connector; and one or more PC Card modules adapted for removable insertion into said one or more slots of said frame, wherein each of said one or more PC Card modules is inserted into one of said one or more slots, said electrical contacts on said PC Card module electrically contact at least a plurality of said plurality of contacts on said module connector, and wherein each of said PC Card modules comprises:
a molded frame having electrical contacts;
a composite substrate;
a cover plate;
a laminate circuit;
film adhesive: and
a plurality of semiconductors on said substrate.

2. The modular PC Card of claim 1, wherein said modular PC Card complies with the PC Card Standard promulgated by the Personal Computer Memory Card International Association.

3. The modular PC Card of claim 1, wherein said socket connector is adapted for insertion into a PC Card adapter socket of a computer system.

4. The modular PC Card of claim 1, wherein said socket connector is adapted for insertion into a PC Card adapter socket of a personal digital assistant.

5. The modular PC Card of claim 1, wherein said frame includes one or more slot openings, wherein said one or more PC Card modules are insertable through said one or more slot openings to be received in said one or more slots.

6. The modular PC Card of claim 1, wherein said frame includes first and second opposite sides and first and second opposite ends, wherein said socket connector is comprised on said first end, and wherein said frame includes said one or more slot openings on said second end of said frame.

7. The modular PC Card of claim 6, wherein said frame includes a telephone connector on said second end of said frame.

8. The modular PC Card of claim 6, wherein said frame includes a network connector on said second end of said frame.

9. The modular PC Card of claim 1, wherein said frame includes first and second opposite sides and first and second opposite ends, wherein said connector is comprised on said first end, and wherein one or more of said one or more slots are comprised on each of said first and second opposite sides.

10. The modular PC Card of claim 9, wherein said frame includes a telephone connector on said second end of said frame.

11. The modular PC Card of claim 9, wherein said frame includes a network connector on said second end of said frame.

12. The modular PC Car of claim 1, wherein said frame includes first and second opposite sides and first and second opposite ends, wherein said socket connector is comprised on said first side.

13. The modular PC Card of claim 1, wherein said frame includes first and second opposite sides and first and second opposite ends, wherein said modular connector is positioned approximately central to said frame approximately equidistant from said first and second opposite sides, wherein said module connector includes contacts on either side of said module connector.

14. The modular PC Card of claim 13, further comprising a rotatable cam positioned with said modular connector inside said frame, wherein said rotatable cam is rotated to move said contacts on said module connector outward to electrically connect said contacts on said module connector to said contacts on one of said one or more PC Card modules when said PC Card module is inserted into one of said one or more slots in said modular PC Card.

15. The modular PC Card of claim 1, further comprising a circuit board comprised within said frame, wherein said circuit board interfaces said one or more PC Card modules to said socket connector.

16. The modular PC Card of claim 1, wherein said frame includes only one slot and said modular PC Card is adapted to receive only one PC Card module.

17. The modular PC Card of claim 1, wherein said frame includes only two slots and said modular PC Card is adapted to receive two PC Card modules.

18. The modular PC Card of claim 1, wherein said frame includes four slots and said modular PC Card is adapted to receive four PC Card modules.

19. A PC Card, comprising:
a PC Card frame including at least one slot for removably receiving modules within said PC Card frame;
a socket connector attached to said PC Card frame for mating to a PC Card socket; and
at least one module adapted for removable insertion into said slot of said PC Card frame, wherein said at least one module comprises:
a frame having a floor member defining an interior portion;
a plurality of electrical contacts along an edge of said frame;
a composite substrate comprising: a circuit layer, a substrate cover plate, and means for adhering said circuit layer to said substrate cover plate;
a plurality of semiconductor devices mounted to said composite substrate to form a composite semiconductor substrate subassembly, wherein said composite substrate is attached to said frame such that at least a portion of said composite semiconductor substrate subassembly is received in said interior portion of said frame and wherein said plurality of semiconductor devices are electrically coupled together; and
electrical connecting means for electrically connecting said semiconductor devices on said composite substrate to said electrical contacts on said edge of said frame.

20. The modular PC Card of claim 19, further comprising:
a module connector comprised in said frame including a plurality of contacts;
wherein said socket connector is electrically connected to said plurality of contacts on said module connector; and
wherein said one or more PC Card modules includes electrical contacts, wherein when one of said one or more PC Card modules is inserted into one of said one or more slots, said electrical contacts on said PC Card module electrically contact at least a plurality of said plurality of contacts on said module connector.

21. The modular PC Card of claim 19, wherein said modular PC Card complies with the PC Card Standard promulgated by the Personal Computer Memory Card International Association.

22. A computer system comprising:
a computer housing including a PC Card adapter slot and a PC Card connector for receiving a PC Card; and
a modular PC Card, comprising:
a frame including one or more slots for receiving PC Card modules;
for each of said one or more slots, a module connector including a plurality of electrical contacts;
a PCMCIA connector attached to said frame adapted for connection to said PC Card connector, wherein said PCMCIA connector is electrically connected to said plurality of electrical contacts on said module connector of each of said slots; and one or more PC Card modules adapted for removable insertion into said one or more slots of said modular PC Card, wherein each of said one or more PC Card modules includes electrical contacts, wherein when one of said one or more modules is inserted into one of said one or more slots, said electrical contacts on said PC Card module electrically contact at least a plurality of contacts on said module connector and wherein said one or more PC Card modules each comprise:
- a frame having a floor member defining an interior portion;
- a plurality of electrical contacts along an edge of said frame;
- a composite substrate comprising: a circuit layer, a substrate cover plate, and means for adhering said circuit layer to said substrate cover plate;
- a plurality of semiconductor devices mounted to said composite substrate to form a composite semiconductor substrate subassembly, wherein said composite substrate is attached to said frame such that at least a portion of said composite semiconductor substrate subassembly is received in said interior portion of said frame and wherein said plurality of semiconductor devices are electrically coupled together; and
- electrical connecting means for electrically connecting said semiconductor devices on said composite substrate to said electrical contacts on said edge of said frame.

* * * * *